(12) United States Patent
Chiron et al.

(10) Patent No.: US 9,197,162 B2
(45) Date of Patent: Nov. 24, 2015

(54) ENVELOPE TRACKING POWER SUPPLY VOLTAGE DYNAMIC RANGE REDUCTION

(71) Applicant: RF Micro Devices, Inc., Greensboro, NC (US)

(72) Inventors: Jean-Frederic Chiron, Tournefeuille (FR); Nadim Khlat, Cugnaux (FR)

(73) Assignee: RF Micro Devices, Inc., Greensboro, NC (US)

(*) Notice: Subject to any disclaimer, the term of this patent is extended or adjusted under 35 U.S.C. 154(b) by 17 days.

(21) Appl. No.: 14/212,199

(22) Filed: Mar. 14, 2014

(65) Prior Publication Data

US 2014/0266428 A1 Sep. 18, 2014

Related U.S. Application Data

(60) Provisional application No. 61/783,934, filed on Mar. 14, 2013.

(51) Int. Cl.
*H01Q 11/12* (2006.01)
*H04B 1/04* (2006.01)
(Continued)

(52) U.S. Cl.
CPC ............. *H03F 1/02* (2013.01); *H03F 1/0222* (2013.01); *H03F 3/189* (2013.01); *H03F 3/20* (2013.01)

(58) Field of Classification Search
CPC ............. H03F 1/0211; H03F 2200/20; H03F 2200/24; H03F 2200/27; H03F 2200/78; H03F 2200/451; H03F 2200/504; H03F 2200/555; H03F 3/20
USPC ......... 455/115.1, 127.1, 127.2; 330/127, 129, 330/285, 296, 297
See application file for complete search history.

(56) References Cited

U.S. PATENT DOCUMENTS

| 3,969,682 A | 7/1976 | Rossum |
| 3,980,964 A | 9/1976 | Grodinsky |

(Continued)

FOREIGN PATENT DOCUMENTS

| CN | 1211355 A | 3/1999 |
| CN | 1518209 A | 8/2004 |

(Continued)

OTHER PUBLICATIONS

Notice of Allowance for U.S. Appl. No. 14/072,140, mailed Dec. 2, 2014, 8 pages.

(Continued)

*Primary Examiner* — Quochien B Vuong
(74) *Attorney, Agent, or Firm* — Withrow & Terranova, P.L.L.C.

(57) ABSTRACT

A radio frequency (RF) system includes an RF power amplifier (PA), which uses an envelope tracking power supply voltage to provide an RF transmit signal, which has an RF envelope; and further includes an envelope tracking power supply, which provides the envelope tracking power supply voltage based on a setpoint. RF transceiver circuitry, which includes envelope control circuitry and an RF modulator is disclosed. The envelope control circuitry provides the setpoint, such that the envelope tracking power supply voltage is clipped to form clipped regions and substantially tracks the RF envelope between the clipped regions, wherein a dynamic range of the envelope tracking power supply voltage is limited. The RF modulator provides an RF input signal to the RF PA, which receives and amplifies the RF input signal to provide the RF transmit signal.

29 Claims, 13 Drawing Sheets

(51) Int. Cl.
*H03G 3/00* (2006.01)
*H03F 3/04* (2006.01)
*H03F 1/02* (2006.01)
*H03F 3/189* (2006.01)
*H03F 3/20* (2006.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 * | 7/2010 | Wilson .................... 323/361 |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |

(56) References Cited

U.S. PATENT DOCUMENTS

| | | |
|---|---|---|
| 8,659,355 B2 | 2/2014 | Henshaw et al. |
| 8,717,100 B2 * | 5/2014 | Reisner et al. ............... 330/127 |
| 8,718,579 B2 | 5/2014 | Drogi et al. |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,884,696 B2 | 11/2014 | Langer |
| 8,909,175 B1 | 12/2014 | McCallister |
| 8,942,651 B2 * | 1/2015 | Jones ...................... 455/127.1 |
| 8,947,162 B2 * | 2/2015 | Wimpenny et al. .......... 330/297 |
| 8,981,847 B2 | 3/2015 | Balteanu |
| 8,994,345 B2 | 3/2015 | Wilson |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0147445 A1 | 6/2013 | Levesque et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0307617 A1 | 11/2013 | Khlat et al. |

(56) References Cited

U.S. PATENT DOCUMENTS

| | | | |
|---|---|---|---|
| 2013/0328613 | A1 | 12/2013 | Kay et al. |
| 2014/0009200 | A1 | 1/2014 | Kay et al. |
| 2014/0009227 | A1 | 1/2014 | Kay et al. |
| 2014/0028370 | A1 | 1/2014 | Wimpenny |
| 2014/0028392 | A1 | 1/2014 | Wimpenny |
| 2014/0049321 | A1 | 2/2014 | Gebeyehu et al. |
| 2014/0103995 | A1 | 4/2014 | Langer |
| 2014/0184335 | A1 | 7/2014 | Nobbe et al. |

FOREIGN PATENT DOCUMENTS

| | | |
|---|---|---|
| CN | 1898860 A | 1/2007 |
| CN | 101201891 A | 6/2008 |
| CN | 101379695 A | 3/2009 |
| CN | 101416385 A | 4/2009 |
| CN | 101427459 A | 5/2009 |
| CN | 101626355 A | 1/2010 |
| CN | 101635697 A | 1/2010 |
| CN | 101867284 A | 10/2010 |
| EP | 0755121 A2 | 1/1997 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

First Office Action for Chinese Patent Application No. 2012800265590, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Notice of Allowance for U.S. Appl. No. 13/948,291, mailed Feb. 11, 2015, 7 pages.
First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US20121062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://

(56) References Cited

OTHER PUBLICATIONS www.mwee.com/en/standardisation-boosts-momentum-for-envelope-tracking.html?cmp_ids=71&news_ids=222901746.

Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM, Oct. 4-6, 2010, pp. 121-124.

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

Non-final Office Action for U.S. Appl. No. 11/113,873, now U.S. Pat. No. 7,773,691, mailed Feb. 1, 2008, 17 pages.

Final Office Action for U.S. Appl. No. 11/113,873, now U.S. Pat. No. 7,773,691, mailed Jul. 30, 2008, 19 pages.

Non-final Office Action for U.S. Appl. No. 11/113,873, now U.S. Pat. No. 7,773,691, mailed Nov. 26, 2008, 22 pages.

Final Office Action for U.S. Appl. No. 11/113,873, now U.S. Pat. No. 7,773,691, mailed May 4, 2009, 20 pages.

Non-final Office Action for U.S. Appl. No. 11/113,873, now U.S. Pat. No. 7,773,691, mailed Feb. 3, 2010, 21 pages.

Notice of Allowance for U.S. Appl. No. 11/113,873, now U.S. Pat. No. 7,773,691, mailed Jun. 9, 2010, 7 pages.

International Search Report for PCT/US06/12619, mailed May 8, 2007, 2 pages.

Extended European Search Report for application 06740532.4, mailed Dec. 7, 2010, 7 pages.

Non-final Office Action for U.S. Appl. No. 12/112,006, mailed Apr. 5, 2010, 6 pages.

Notice of Allowance for U.S. Appl. No. 12/112,006, mailed Jul. 19, 2010, 6 pages.

Non-Final Office Action for U.S. Appl. No. 12/836,307, mailed Nov. 5, 2013, 6 pages.

Notice of Allowance for U.S. Appl. No. 12/836,307, mailed May 5, 2014, 6 pages.

Non-final Office Action for U.S. Appl. No. 13/089,917, mailed Nov. 23, 2012, 6 pages.

Examination Report for European Patent Application No. 11720630, mailed Aug. 16, 2013, 5 pages.

Examination Report for European Patent Application No. 11720630.0, issued Mar. 18, 2014, 4 pages.

European Search Report for European Patent Application No. 14162682.0, issued Aug. 27, 2014, 7 pages.

International Search Report for PCT/US11/033037, mailed Aug. 9, 2011, 10 pages.

International Preliminary Report on Patentability for PCT/US2011/033037, mailed Nov. 1, 2012, 7 pages.

Non-Final Office Action for U.S. Appl. No. 13/188,024, mailed Feb. 5, 2013, 8 pages.

Notice of Allowance for U.S. Appl. No. 13/188,024, mailed Jun. 18, 2013, 8 pages.

International Search Report for PCT/US2011/044857, mailed Oct. 24, 2011, 10 pages.

International Preliminary Report on Patentability for PCT/US20111044857, mailed Mar. 7, 2013, 6 pages.

Non-final Office Action for U.S. Appl. No. 13/218,400, mailed Nov. 8, 2012, 7 pages.

Notice of Allowance for U.S. Appl. No. 13/218,400, mailed Apr. 11, 2013, 7 pages.

International Search Report for PCT/US11/49243, mailed Dec. 22, 2011, 9 pages.

International Preliminary Report on Patentability for PCT/US11/49243, mailed Nov. 13, 2012, 33 pages.

International Search Report for PCT/US2011/054106, mailed Feb. 9, 2012, 11 pages.

International Preliminary Report on Patentability for PCT/US2011/054106, mailed Apr. 11, 2013, 8 pages.

Notice of Allowance for U.S. Appl. No. 13/297,490, mailed Feb. 27, 2014, 7 pages.

Invitation to Pay Additional Fees for PCT/US2011/061007, mailed Feb. 13, 2012, 7 pages.

International Search Report for PCT/US2011/061007, mailed Aug. 16, 2012, 16 pages.

International Preliminary Report on Patentability for PCT/US2011/061007, mailed May 30, 2013, 11 pages.

Non-Final Office Action for U.S. Appl. No. 13/297,470, mailed May 8, 2013, 15 pages.

Final Office Action for U.S. Appl. No. 13/297,470, mailed Oct. 25, 2013, 17 pages.

Non-Final Office Action for U.S. Appl. No. 13/297,470, mailed Feb. 20, 2014, 16 pages.

International Search Report for PCT/US2011/061009, mailed Feb. 8, 2012, 14 pages.

International Preliminary Report on Patentability for PCT/US2011/061009, mailed May 30, 2013, 10 pages.

Notice of Allowance for U.S. Appl. No. 14/022,858, mailed Oct. 25, 2013, 9 pages.

Notice of Allowance for U.S. Appl. No. 14/022,858, mailed May 27, 2014, 6 pages.

Notice of Allowance for U.S. Appl. No. 13/343,840, mailed Jul. 1, 2013, 8 pages.

International Search Report for PCT/US2012/023495, mailed May 7, 2012, 13 pages.

International Preliminary Report on Patentability for PCT/US2012/023495, mailed Aug. 15, 2013, 10 pages.

(56) References Cited

OTHER PUBLICATIONS

Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No.13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
European Examination Report for European Patent Application No. 14162682.0, mailed May 22, 2015, 5 pages.
International Preliminary Report on Patentability for PCT/US2013/065403, mailed Apr. 30, 2015, 8 pages.
Corrected Notice of Allowance for U.S. Appl. No. 13/297,470, mailed Jun. 5, 2015, 11 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action and Search Report for Chinese Patent Application No. 2012800079417, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.

(56) References Cited

OTHER PUBLICATIONS

Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Non-Final Office Action for U.S. Appl. No. 14/254,215, mailed Oct. 15, 2015, 5 pages.

* cited by examiner

ENVELOPE TRACKING POWER SUPPLY VOLTAGE DYNAMIC RANGE REDUCTION

RELATED APPLICATIONS

This application claims the benefit of U.S. provisional patent application number 61/783,934, filed Mar. 14, 2013, the disclosure of which is incorporated herein by reference in its entirety.

FIELD OF THE DISCLOSURE

Embodiments of the present disclosure relate to envelope tracking power supplies and radio frequency (RF) power amplifiers, either of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, noise limitations, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

A radio frequency (RF) system includes an RF power amplifier (PA), which uses an envelope tracking power supply voltage to provide an RF transmit signal, which has an RF envelope; and further includes an envelope tracking power supply, which provides the envelope tracking power supply voltage based on a setpoint. RF transceiver circuitry, which includes envelope control circuitry and an RF modulator is disclosed, according to one embodiment of the present disclosure. The envelope control circuitry provides the setpoint, such that the envelope tracking power supply voltage is clipped to form clipped regions and substantially tracks the RF envelope between the clipped regions, wherein a dynamic range of the envelope tracking power supply voltage is limited. The RF modulator provides an RF input signal to the RF PA, which receives and amplifies the RF input signal to provide the RF transmit signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A radio frequency (RF) system includes an RF power amplifier (PA), which uses an envelope tracking power supply voltage to provide an RF transmit signal, which has an RF envelope; and further includes an envelope tracking power supply, which provides the envelope tracking power supply voltage based on a setpoint. RF transceiver circuitry, which includes envelope control circuitry and an RF modulator is disclosed, according to one embodiment of the present disclosure. The envelope control circuitry provides the setpoint, such that the envelope tracking power supply voltage is clipped to form clipped regions and substantially tracks the RF envelope between the clipped regions, wherein a dynamic range of the envelope tracking power supply voltage is limited. The RF modulator provides an RF input signal to the RF PA, which receives and amplifies the RF input signal to provide the RF transmit signal.

Figure 1:
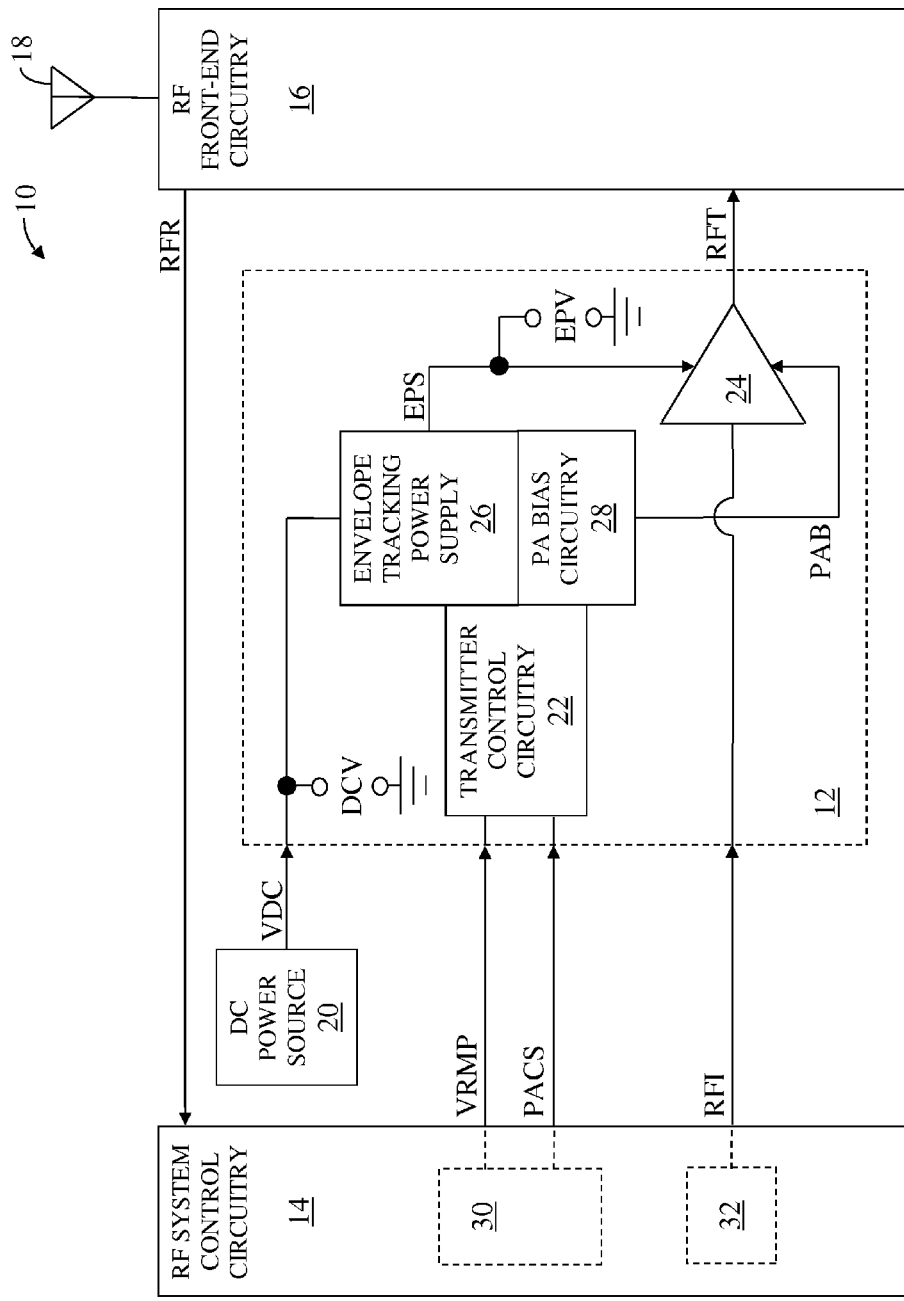
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28. The RF system control circuitry 14 includes envelope control circuitry 30 and an RF modulator 32.

In one embodiment of the RF communications system 10, the RF front-end circuitry 16 receives via the RF antenna 18, processes, and forwards an RF receive signal RFR to the RF system control circuitry 14. In general, the RF system control circuitry 14 provides an envelope power supply control signal VRMP and a transmitter configuration signal PACS to the transmitter control circuitry 22. Further, the RF system control circuitry 14 provides an RF input signal RFI to the RF PA 24. Specifically, the envelope control circuitry 30 provides the envelope power supply control signal VRMP and the RF modulator 32 provides the RF input signal RFI. The DC power source 20 provides a DC source signal VDC to the envelope tracking power supply 26. The DC source signal VDC has a DC source voltage DCV. In one embodiment of the DC power source 20, the DC power source 20 is a battery.

In one embodiment of the envelope control circuitry 30, the envelope control circuitry 30 provides a constrained setpoint via the envelope power supply control signal VRMP. The constrained setpoint limits a dynamic range of an envelope tracking power supply voltage EPV. In one embodiment of the envelope control circuitry 30, the envelope control circuitry 30 provides the transmitter configuration signal PACS to the transmitter control circuitry 22. In an alternate embodiment of the envelope control circuitry 30 and the transmitter control circuitry 22, the envelope control circuitry 30 provides a setpoint to the transmitter control circuitry 22 via the envelope power supply control signal VRMP, and the transmitter control circuitry 22 provides the constrained setpoint based on the setpoint.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The envelope power supply signal EPS has the envelope tracking power supply voltage EPV. As such, the envelope tracking power supply 26 provides the envelope tracking power supply voltage EPV. The DC source signal VDC provides power to the envelope tracking power supply 26. As such, the envelope power supply signal EPS is based on the DC source signal VDC. In general, the envelope power supply control signal VRMP is representative of a setpoint of the envelope tracking power supply voltage EPV. The setpoint of the envelope tracking power supply voltage EPV is a desired magnitude of the envelope tracking power supply voltage EPV that the envelope tracking power supply 26 endeavors to reach. In one embodiment of the setpoint, the setpoint is the constrained setpoint.

Figure 2:
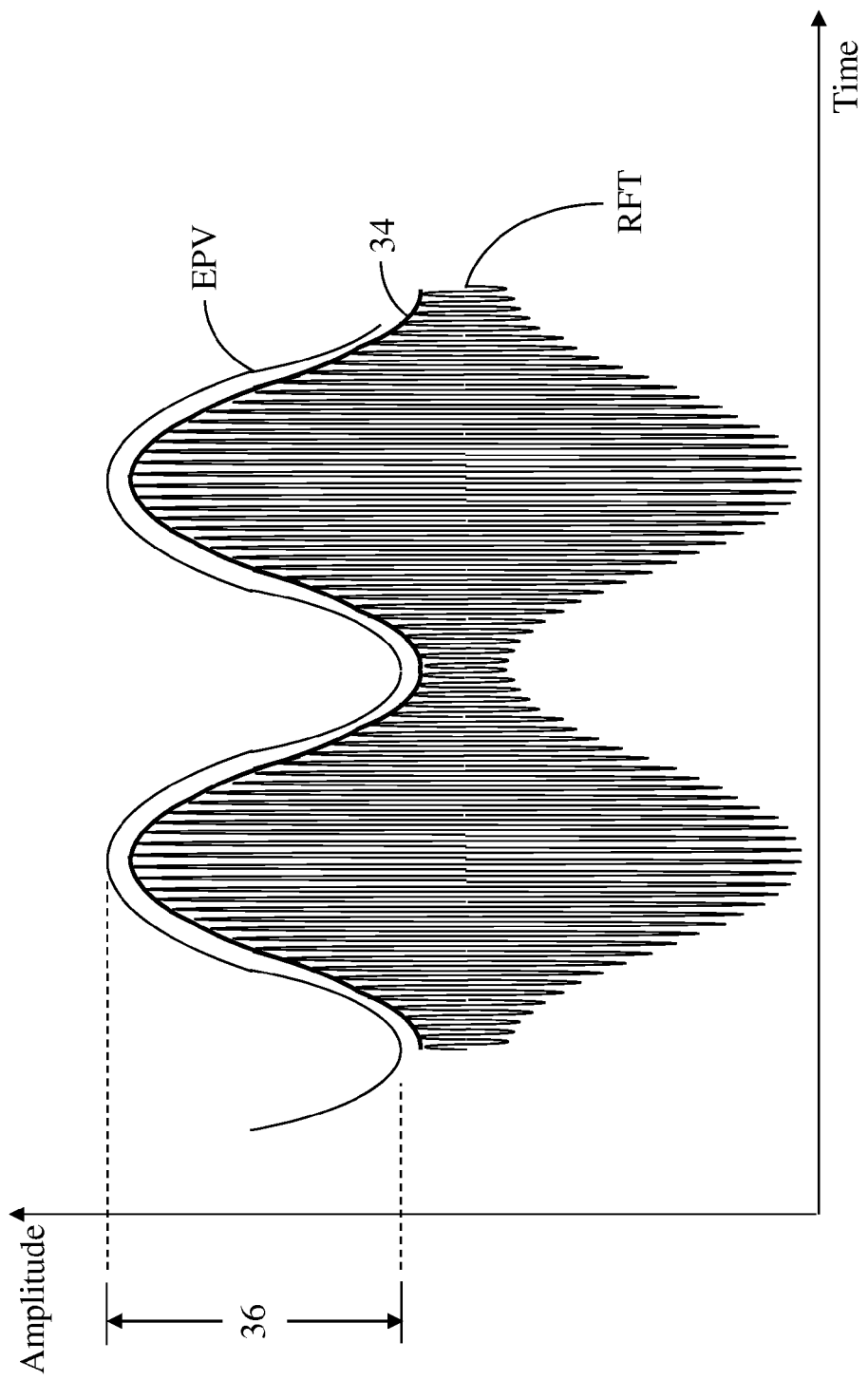
FIG. 2 is a graph illustrating an RF transmit signal and an envelope tracking power supply voltage shown in FIG. 1 according to an additional embodiment of the RF transmit signal and the envelope tracking power supply voltage.

In this regard, the envelope tracking power supply 26 provides the envelope tracking power supply voltage EPV based on the setpoint, or the constrained setpoint, of the envelope tracking power supply voltage EPV. The RF PA 24 receives and amplifies the RF input signal RFI to provide an RF transmit signal RFT using the envelope tracking power supply voltage EPV. The RF transmit signal RFT has an RF envelope 34 (FIG. 2). The envelope tracking power supply voltage EPV provides power for amplification. In one embodiment of the envelope tracking power supply 26, the envelope tracking power supply voltage EPV is based on the constrained setpoint and at least partially tracks the RF envelope 34 (FIG. 2).

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the envelope control circuitry 30, the envelope control circuitry 30 provides the transmitter configuration signal PACS to the transmitter control circuitry 22. In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include the envelope control circuitry 30, the RF modulator 32, an RF transceiver IC, baseband controller circuitry, the like, or any combination thereof.

FIG. 2 is a graph illustrating the RF transmit signal RFT and the envelope tracking power supply voltage EPV shown in FIG. 1 according to one embodiment of the RF transmit signal RFT and the envelope tracking power supply voltage EPV. In one embodiment of the RF input signal RFI (FIG. 1), the RF input signal RFI (FIG. 1) is amplitude modulated. As such, the RF transmit signal RFT is also amplitude modulated, as illustrated in FIG. 2. Since the amplitude of the RF transmit signal RFT is modulated, the amplitude of the RF transmit signal RFT traverses within the RF envelope 34 of the RF transmit signal RFT. For proper operation of the RF PA 24 (FIG. 1), the envelope tracking power supply voltage EPV must be high enough to accommodate the RF envelope 34 of the RF transmit signal RFT. However, to increase efficiency in the RF PA 24 (FIG. 1), the envelope tracking power supply voltage EPV at least partially tracks the RF envelope 34 of the RF transmit signal RFT as illustrated in FIG. 2. This tracking by the envelope tracking power supply voltage EPV is called envelope tracking.

In this regard, in one embodiment of the envelope power supply control signal VRMP (FIG. 1), since the envelope power supply control signal VRMP (FIG. 1) is representative of the setpoint of the envelope tracking power supply voltage EPV, the envelope power supply control signal VRMP (FIG. 1) is amplitude modulated to provide at least partial envelope tracking of the RF transmit signal RFT by causing the envelope tracking power supply voltage EPV to be amplitude modulated. As such, the envelope tracking power supply voltage EPV has an unconstrained dynamic range 36, as illustrated in FIG. 2.

In many RF communications protocols, the RF envelope 34 may have a high bandwidth. Tens of megahertz of bandwidth are not uncommon. As a result, the envelope tracking power supply 26 (FIG. 1) may have difficulty in providing the unconstrained dynamic range 36 of the envelope tracking power supply voltage EPV with high efficiency. To improve the efficiency of the envelope tracking power supply 26 (FIG. 1), it may be beneficial to reduce the unconstrained dynamic range 36 of the envelope tracking power supply voltage EPV. As previously mentioned, the constrained setpoint limits the dynamic range of the envelope tracking power supply voltage EPV and causes the envelope tracking power supply voltage EPV to be clipped periodically, which may increase efficiency of the envelope tracking power supply 26 (FIG. 1).

Figure 3:
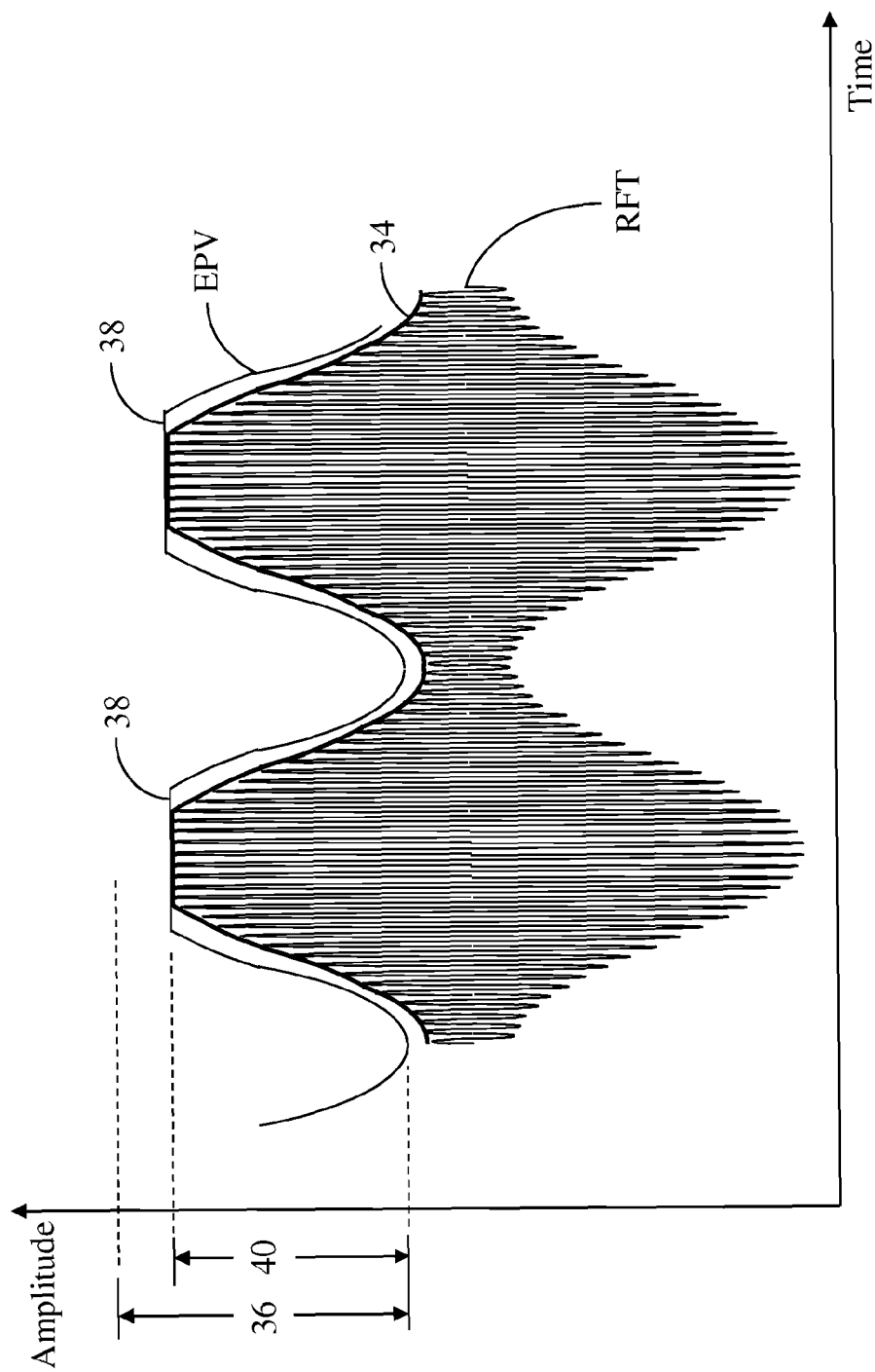
FIG. 3 is a graph illustrating the RF transmit signal and the envelope tracking power supply voltage shown in FIG. 1 according to an alternate embodiment of the RF transmit signal and the envelope tracking power supply voltage.

FIG. 3 is a graph illustrating the RF transmit signal RFT and the envelope tracking power supply voltage EPV shown in FIG. 1 according to an alternate embodiment of the RF transmit signal RFT and the envelope tracking power supply voltage EPV. The envelope tracking power supply voltage EPV illustrated in FIG. 3 is limited on a high side by a high side constraint 38. As a result, the unconstrained dynamic range 36 is reduced to a high side constrained dynamic range 40. This dynamic range reduction may increase the efficiency of the envelope tracking power supply 26 (FIG. 1). As such, the constrained setpoint is based on the high side constraint 38 of the envelope tracking power supply voltage EPV, which has a dynamic range that is limited to the high side constrained dynamic range 40. The high side of the RF transmit signal RFT may be clipped by using the constrained setpoint. As such, the envelope tracking power supply voltage EPV may be clipped to form clipped regions, which correspond to peaks in the RF envelope 34. In this regard, the envelope tracking power supply voltage EPV substantially tracks the RF envelope 34 between the clipped regions. However, if excursions of the RF transmit signal RFT above the high side constraint 38 are relatively infrequent, then any RF performance degradation resulting from the dynamic range reduction may be acceptable.

Figure 4:
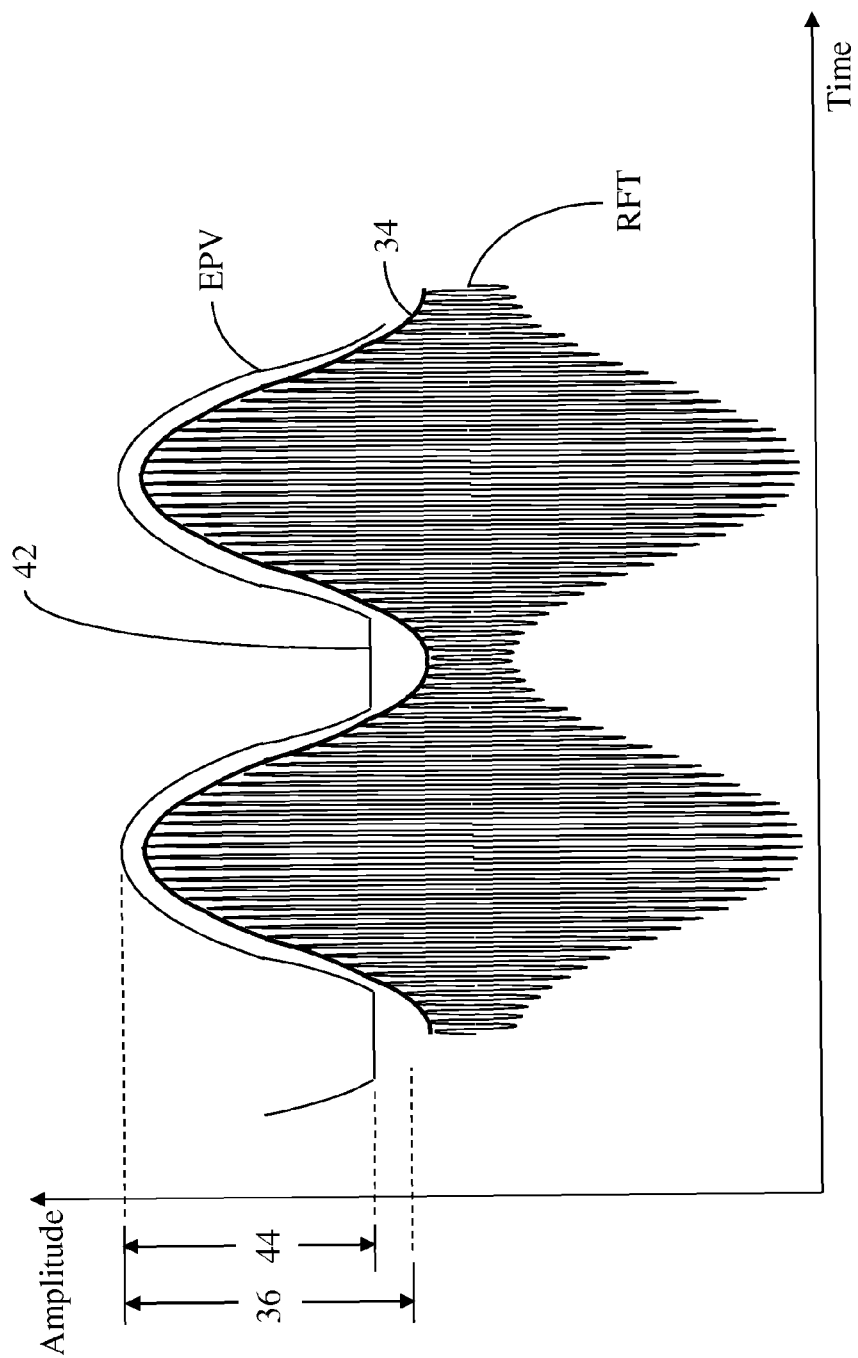
FIG. 4 is a graph illustrating the RF transmit signal and the envelope tracking power supply voltage shown in FIG. 1 according to another embodiment of the RF transmit signal and the envelope tracking power supply voltage.

FIG. 4 is a graph illustrating the RF transmit signal RFT and the envelope tracking power supply voltage EPV shown in FIG. 1 according to another embodiment of the RF transmit signal RFT and the envelope tracking power supply voltage EPV. The envelope tracking power supply voltage EPV illustrated in FIG. 4 is limited on a low side by a low side constraint 42. As a result, the unconstrained dynamic range 36 is reduced to a low side constrained dynamic range 44. As such, the constrained setpoint is based on the low side constraint 42 of the envelope tracking power supply voltage EPV, which has a dynamic range that is limited to the low side constrained dynamic range 44. This dynamic range reduction may increase a voltage drop between the envelope tracking power supply voltage EPV and the RF envelope 34 in the RF PA 24 (FIG. 1), which may reduce the efficiency of the RF PA 24 (FIG. 1). However, the efficiency loss in the RF PA 24 may be more than compensated by an efficiency increase in the envelope tracking power supply 26 (FIG. 1). Further, the envelope tracking power supply voltage EPV may be clipped to form clipped regions, which correspond to valleys in the RF envelope 34. In this regard, the envelope tracking power supply voltage EPV substantially tracks the RF envelope 34 between the clipped regions.

Figure 5:
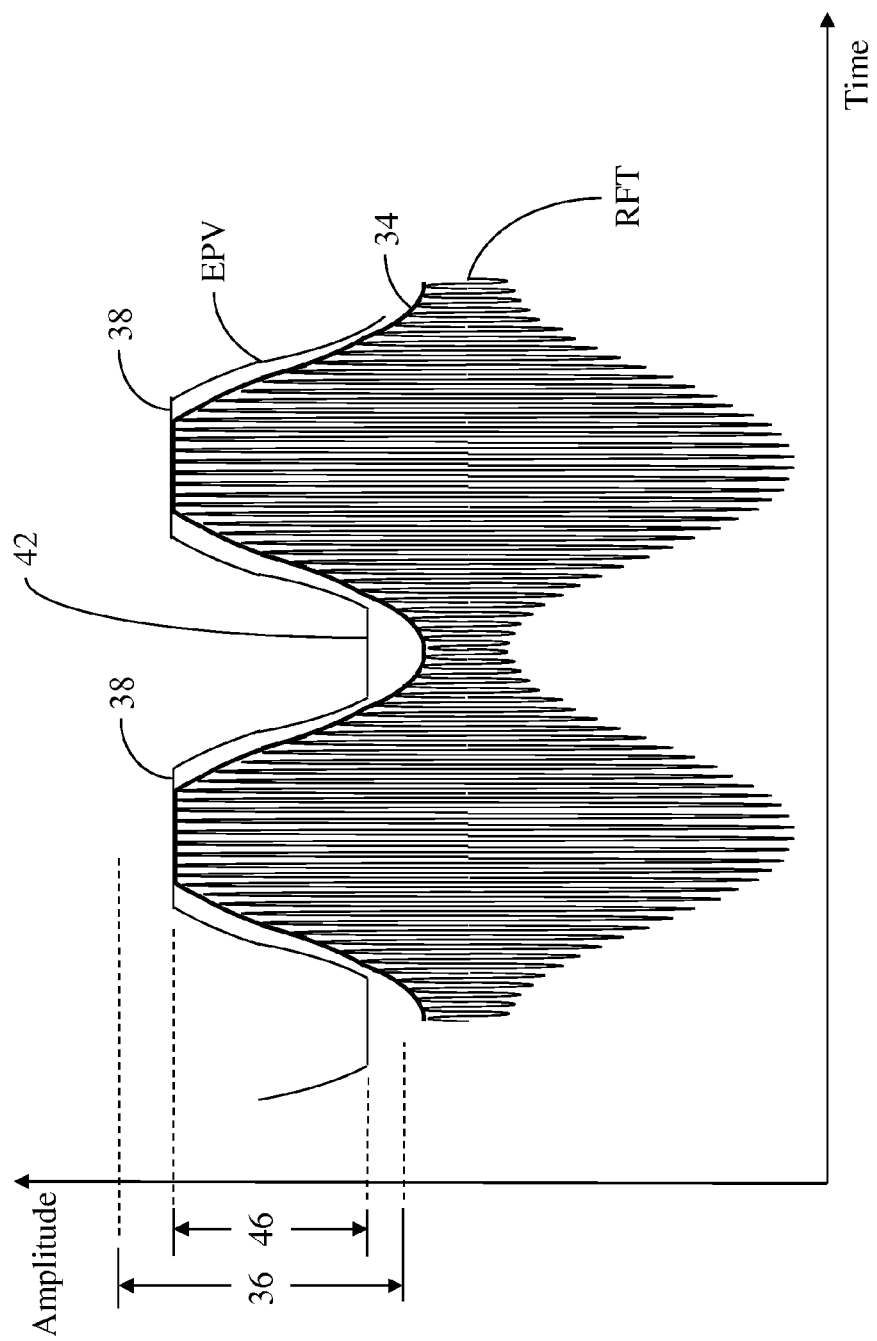
FIG. 5 is a graph illustrating the RF transmit signal and the envelope tracking power supply voltage shown in FIG. 1 according to a further embodiment of the RF transmit signal and the envelope tracking power supply voltage.

FIG. 5 is a graph illustrating the RF transmit signal RFT and the envelope tracking power supply voltage EPV shown in FIG. 1 according to a further embodiment of the RF transmit signal RFT and the envelope tracking power supply voltage EPV. The envelope tracking power supply voltage EPV illustrated in FIG. 5 is both limited on the low side by the low side constraint 42 and limited on the high side by the high side constraint 38. As a result, the unconstrained dynamic range 36 is reduced to a both sides constrained dynamic range 46. As such, the constrained setpoint is based on both the low side constraint 42 and the high side constraint 38 of the envelope tracking power supply voltage EPV, which has a dynamic range that is limited to the both sides constrained dynamic range 46. Further, the envelope tracking power supply voltage EPV may be clipped to form clipped regions, which correspond to both peaks and valleys in the RF envelope 34. In this regard, the envelope tracking power supply voltage EPV substantially tracks the RF envelope 34 between the clipped regions.

Figure 6:
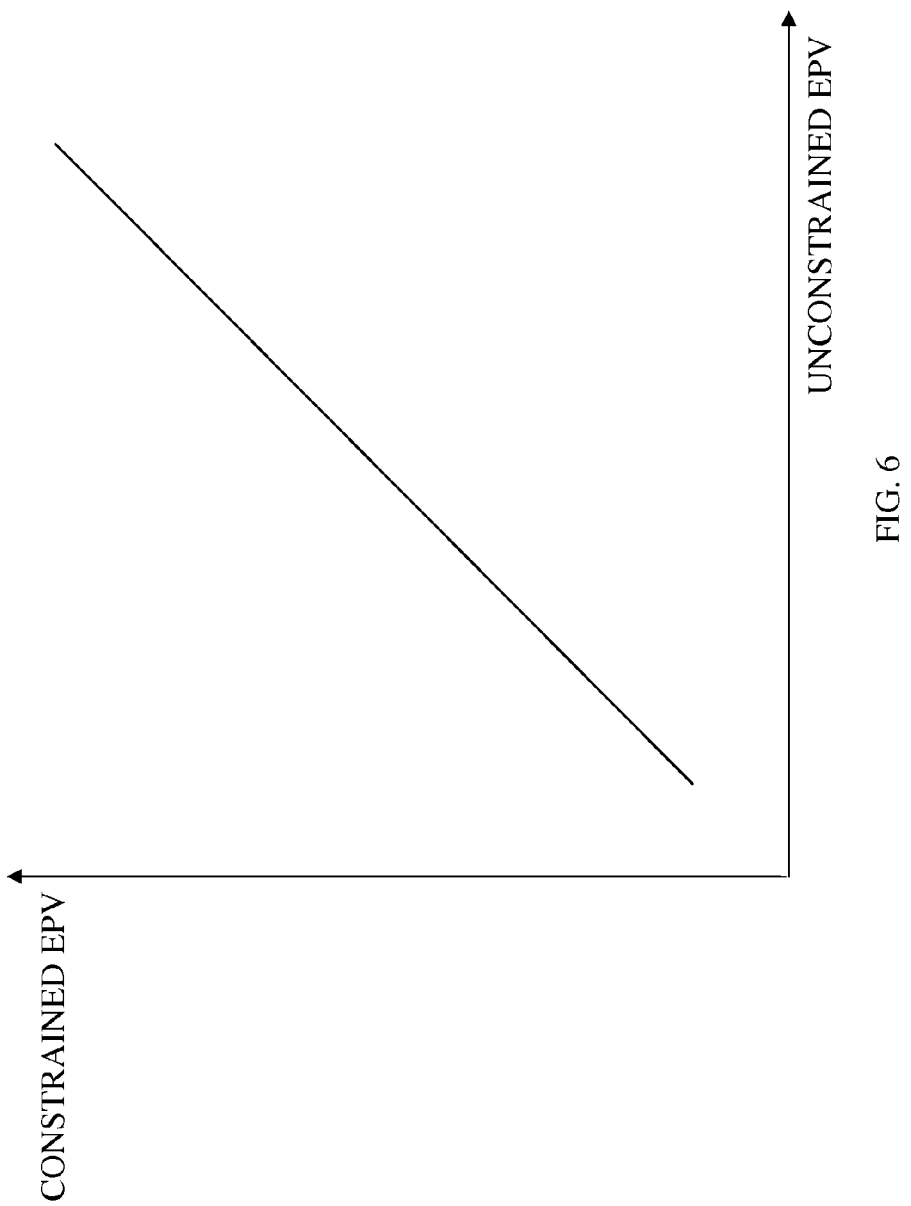
FIG. 6 is a graph illustrating a relationship between an unconstrained envelope tracking power supply voltage (UNCONSTRAINED EPV) and a constrained envelope tracking power supply voltage (CONSTRAINED EPV) as provided by an envelope tracking power supply illustrated in FIG. 1.

FIG. 6 is a graph illustrating a relationship between an unconstrained envelope tracking power supply voltage (UNCONSTRAINED EPV) and a constrained envelope tracking power supply voltage (CONSTRAINED EPV) as provided by the envelope tracking power supply 26 (FIG. 1). The UNCONSTRAINED EPV is representative of an unconstrained setpoint and the CONSTRAINED EPV is representative of the constrained setpoint. In FIG. 6, the envelope tracking power supply voltage EPV has no dynamic range reduction. As a result, there is a one-to-one relationship between the CONSTRAINED EPV and the UNCONSTRAINED EPV.

Figure 7:
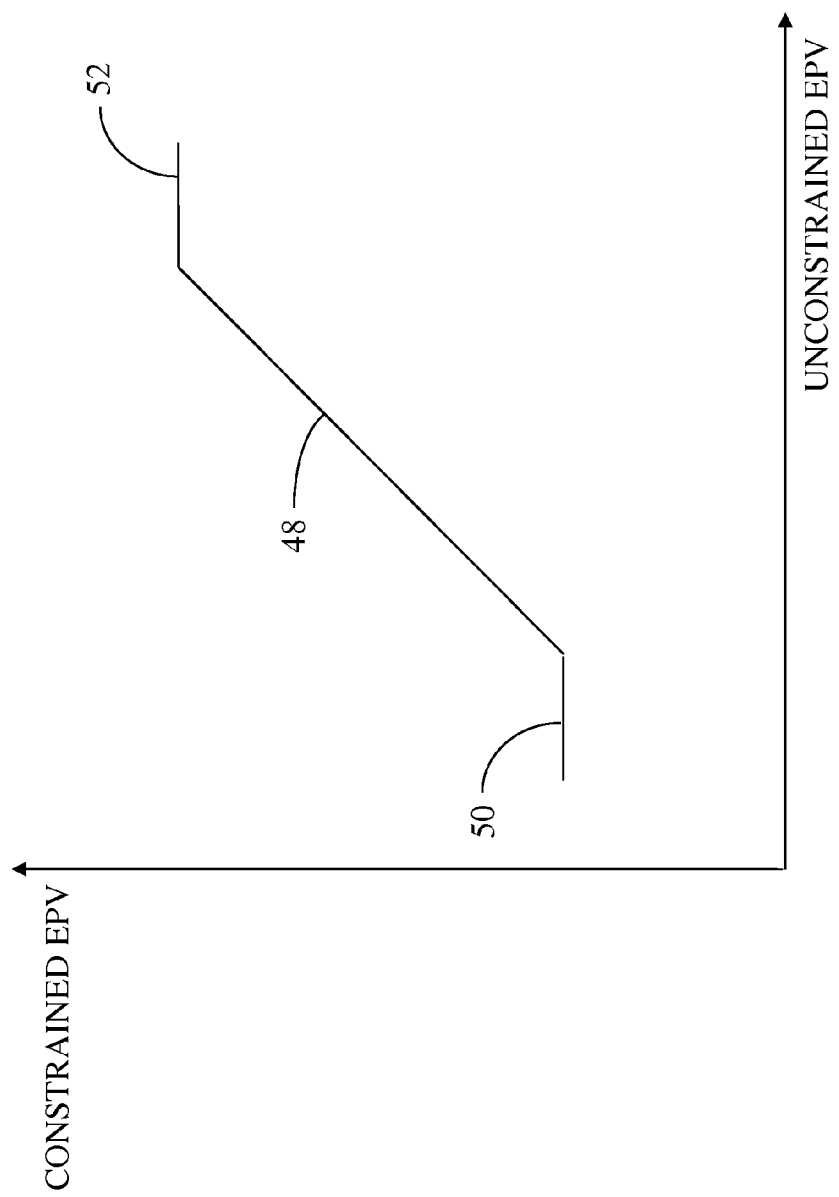
FIG. 7 is a graph illustrating the relationship between the UNCONSTRAINED EPV and the CONSTRAINED EPV according to one embodiment of the envelope tracking power supply.

FIG. 7 is a graph illustrating the relationship between the UNCONSTRAINED EPV and the CONSTRAINED EPV according to one embodiment of the envelope tracking power supply 26 (FIG. 1). In FIG. 7, the constrained setpoint is based on both the low side constraint 42 (FIG. 5) and the high side constraint 38 (FIG. 5) of the envelope tracking power supply voltage EPV. As a result, the relationship between the CONSTRAINED EPV and the UNCONSTRAINED EPV has an unconstrained operating region 48, a low side constrained operating region 50, and a high side constrained operating region 52. In the unconstrained operating region 48 there is a one-to-one relationship between the CONSTRAINED EPV and the UNCONSTRAINED EPV, such that a slope of a CONSTRAINED EPV/UNCONSTRAINED EPV curve is equal to about one. In the low side constrained operating region 50, the CONSTRAINED EPV remains about constant, such that the slope of a CONSTRAINED EPV/UNCONSTRAINED EPV curve is equal to about zero. In the high side constrained operating region 52, the CONSTRAINED EPV remains about constant, such that the slope of a CONSTRAINED EPV/UNCONSTRAINED EPV curve is equal to about zero.

When the UNCONSTRAINED EPV is less than the low side constraint 42 (FIG. 5), the envelope tracking power supply 26 (FIG. 1) operates in the low side constrained operating region 50. When the UNCONSTRAINED EPV is greater than the high side constraint 38 (FIG. 5), the envelope tracking power supply 26 (FIG. 1) operates in the high side constrained operating region 52. When the UNCONSTRAINED EPV is between the low side constraint 42 (FIG. 5) and the high side constraint 38 (FIG. 5), the envelope tracking power supply 26 (FIG. 1) operates in the unconstrained operating region 48.

When transitioning between the unconstrained operating region 48 and the low side constrained operating region 50, the CONSTRAINED EPV is hard clipped in the low side constrained operating region 50. Further, when transitioning between the unconstrained operating region 48 and the high side constrained operating region 52, the CONSTRAINED EPV is hard clipped in the high side constrained operating region 52.

Figure 8:
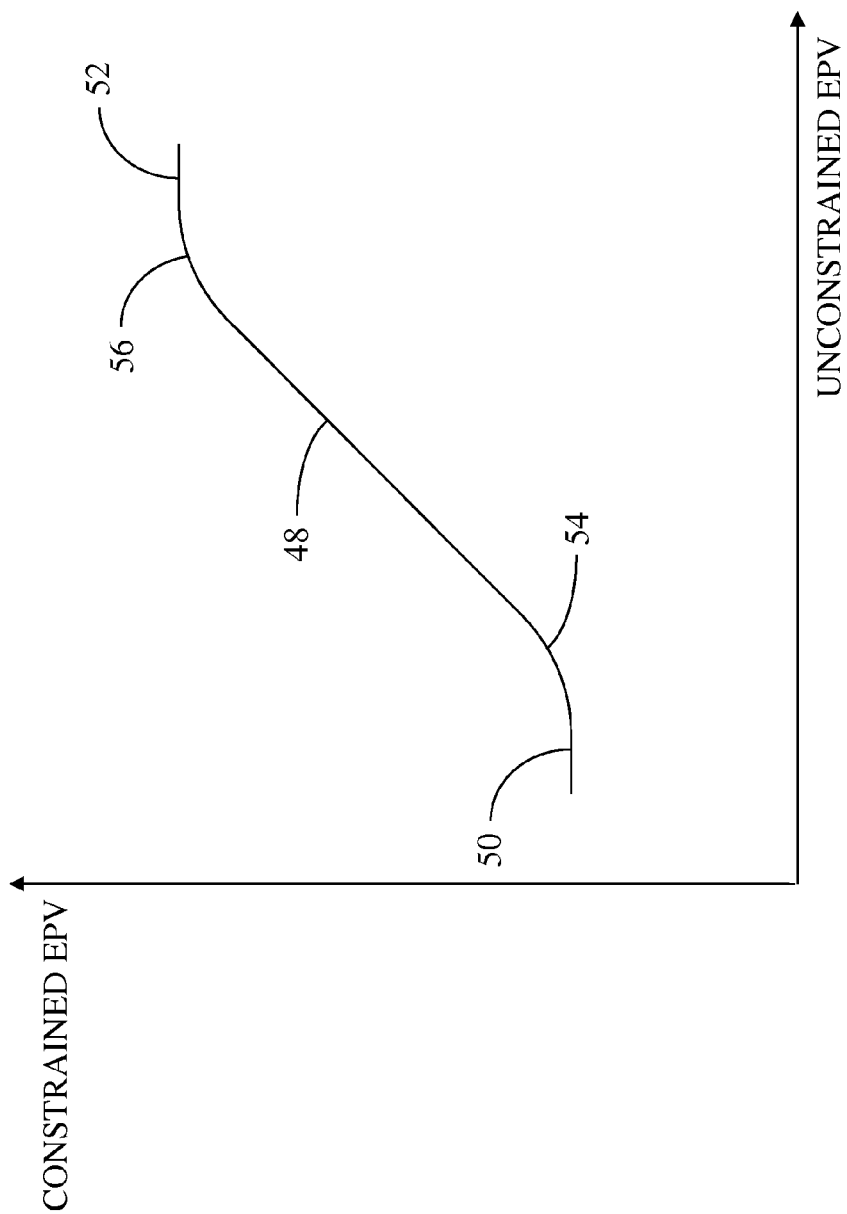
FIG. 8 is a graph illustrating the relationship between the UNCONSTRAINED EPV and the CONSTRAINED EPV according to an alternate embodiment of the envelope tracking power supply.

FIG. 8 is a graph illustrating the relationship between the UNCONSTRAINED EPV and the CONSTRAINED EPV according to an alternate embodiment of the envelope tracking power supply 26 (FIG. 1). The relationship between the UNCONSTRAINED EPV and the CONSTRAINED EPV illustrated in FIG. 8 is similar to the relationship between the UNCONSTRAINED EPV and the CONSTRAINED EPV illustrated in FIG. 7, except in the relationship between the UNCONSTRAINED EPV and the CONSTRAINED EPV illustrated in FIG. 8, there is a low side transition operating region 54 between the unconstrained operating region 48 and the low side constrained operating region 50, and there is a high side transition operating region 56 between the unconstrained operating region 48 and the high side constrained operating region 52.

As such, when transitioning between the unconstrained operating region 48 and the low side constrained operating region 50, the CONSTRAINED EPV is smoothly clipped between the unconstrained operating region 48 and the low side constrained operating region 50. Similarly, when transitioning between the unconstrained operating region 48 and the high side constrained operating region 52, the CONSTRAINED EPV is smoothly clipped between the unconstrained operating region 48 and the high side constrained operating region 52.

In this regard, in the low side transition operating region 54, the CONSTRAINED EPV may be based on a $3^{RD}$ order polynomial between the unconstrained operating region 48 and the low side constrained operating region 50. In one embodiment of the low side transition operating region 54, at a connection point, which connects the unconstrained operating region 48 to the low side transition operating region 54, the slope of the CONSTRAINED EPV/UNCONSTRAINED EPV curve in the unconstrained operating region 48 is about equal to the slope of the CONSTRAINED EPV/UNCONSTRAINED EPV curve in the low side transition operating region 54. Further, at a connection point, which connects the low side constrained operating region 50 to the low side transition operating region 54, the slope of the CONSTRAINED EPV/UNCONSTRAINED EPV curve in the low side constrained operating region 50 is about equal to the slope of the CONSTRAINED EPV/UNCONSTRAINED EPV curve in the low side transition operating region 54.

Similarly, in the high side transition operating region 56, the CONSTRAINED EPV may be based on a $3^{RD}$ order polynomial between the unconstrained operating region 48 and the high side constrained operating region 52. In one embodiment of the high side transition operating region 56, at a connection point, which connects the unconstrained operating region 48 to the high side transition operating region 56, the slope of the CONSTRAINED EPV/UNCONSTRAINED EPV curve in the unconstrained operating region 48 is about equal to the slope of the CONSTRAINED EPV/UNCONSTRAINED EPV curve in the high side transition operating region 56. Further, at a connection point, which connects the high side constrained operating region 52 to the high side transition operating region 56, the slope of the CONSTRAINED EPV/UNCONSTRAINED EPV curve in the high side constrained operating region 52 is about equal to the slope of the CONSTRAINED EPV/UNCONSTRAINED EPV curve in the high side transition operating region 56.

As such, the relationship between the CONSTRAINED EPV and the UNCONSTRAINED EPV may be defined by a piecewise function, which integrates the regions defined by the unconstrained operating region 48, the low side constrained operating region 50, the high side constrained operating region 52, the low side transition operating region 54, and the high side transition operating region 56. Each of the unconstrained operating region 48, the low side constrained operating region 50, the high side constrained operating region 52, the low side transition operating region 54, and the high side transition operating region 56 is a corresponding piece in the piecewise function. In one embodiment of the piecewise function, the piecewise function is a piecewise spline function. A piecewise spline function is defined as a piecewise function that possesses a high degree of smoothness at the places where the pieces of the piecewise function connect. In this regard, the function illustrated in FIG. 8 is a piecewise spline function.

In one embodiment of the envelope tracking power supply 26 (FIG. 1), in the low side transition operating region 54, the CONSTRAINED EPV is based on a piecewise spline function between the unconstrained operating region 48 and the low side constrained operating region 50. Similarly, in the high side transition operating region 56, the CONSTRAINED EPV is based on a piecewise spline function between the unconstrained operating region 48 and the high side constrained operating region 52.

Figure 9:
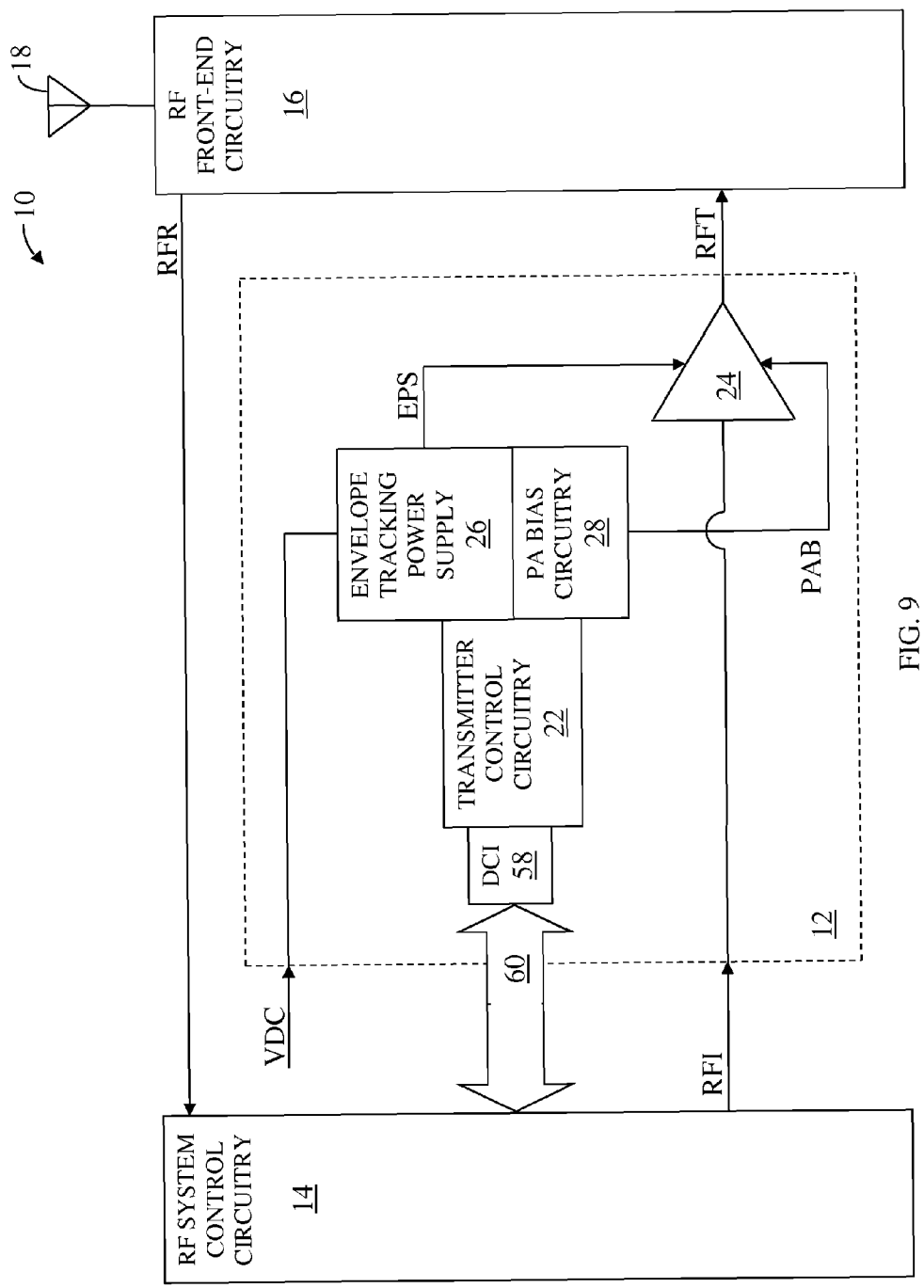
FIG. 9 shows the RF communications system according to an alternate embodiment of the RF communications system.

FIG. 9 shows the RF communications system 10 according to an alternate embodiment of the RF communications system 10. The RF communications system 10 illustrated in FIG. 9 is similar to the RF communications system 10 illustrated in FIG. 1, except in the RF communications system 10 illustrated in FIG. 9, the RF transmitter circuitry 12 further includes a digital communications interface 58, which is coupled between the transmitter control circuitry 22 and a digital communications bus 60. The digital communications bus 60 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 60 and the digital communications interface 58.

In one embodiment of the RF communications system 10, the RF system control circuitry 14 is the RF transceiver circuitry, which provides the constrained setpoint of the envelope tracking power supply voltage EPV to the envelope tracking power supply 26 via the envelope power supply control signal VRMP. Further, the RF transceiver circuitry provides the envelope power supply control signal VRMP (FIG. 1) and the transmitter configuration signal PACS (FIG. 1) to the transmitter control circuitry 22 via the digital communications bus 60 and the digital communications interface 58. In one embodiment of the RF transceiver circuitry, the RF transceiver circuitry provides the envelope power supply control signal VRMP (FIG. 1) to the envelope tracking power supply 26 via the digital communications bus 60 and the digital communications interface 58.

Figure 10:
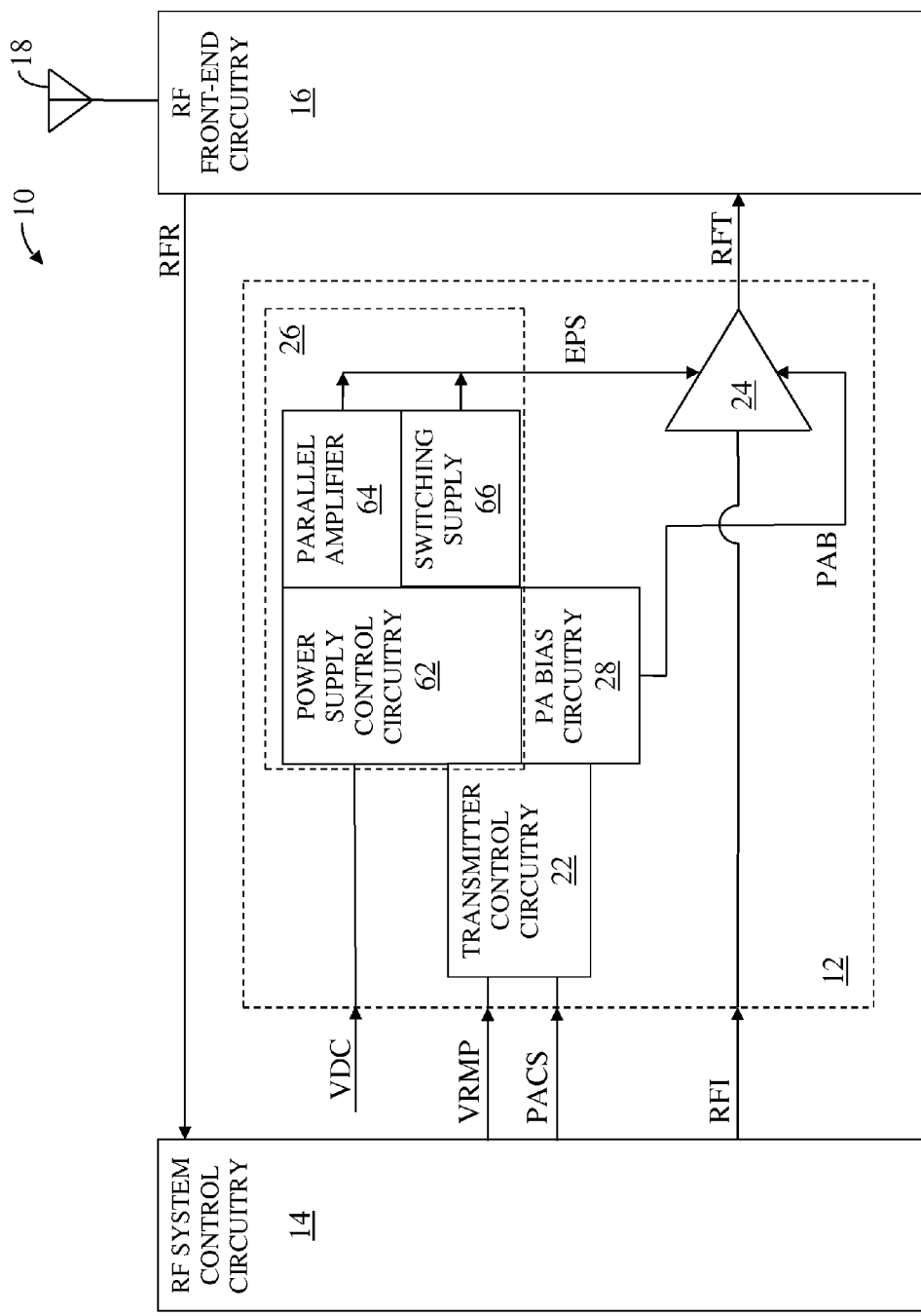
FIG. 10 shows details of an envelope tracking power supply illustrated in FIG. 1 according to one embodiment of the envelope tracking power supply.

FIG. 10 shows details of the envelope tracking power supply 26 illustrated in FIG. 1 according to one embodiment of the envelope tracking power supply 26. The envelope tracking power supply 26 includes power supply control circuitry 62, a parallel amplifier 64, and a switching supply 66. The power supply control circuitry 62 is coupled to the transmitter control circuitry 22, the parallel amplifier 64 is coupled to the power supply control circuitry 62, and the switching supply 66 is coupled to the power supply control circuitry 62. The transmitter control circuitry 22 provides the constrained setpoint of the envelope tracking power supply voltage EPV (FIG. 1) to the power supply control circuitry 62.

The power supply control circuitry 62 controls the parallel amplifier 64 and the switching supply 66 based on the constrained setpoint of the envelope tracking power supply voltage EPV (FIG. 1). The parallel amplifier 64 and the switching supply 66 provide the envelope tracking power supply voltage EPV (FIG. 1), such that the parallel amplifier 64 partially provides the envelope tracking power supply voltage EPV (FIG. 1) and the switching supply 66 partially provides the envelope tracking power supply voltage EPV (FIG. 1). The switching supply 66 may provide power more efficiently than the parallel amplifier 64. However, the parallel amplifier 64 may provide the envelope tracking power supply voltage EPV (FIG. 1) more accurately than the switching supply 66. As such, the parallel amplifier 64 regulates the envelope tracking power supply voltage EPV (FIG. 1) based on the constrained setpoint of the envelope tracking power supply voltage EPV (FIG. 1) and the switching supply 66 operates to drive an output current from the parallel amplifier 64 toward zero to increase efficiency. In this regard, the parallel amplifier 64 behaves like a voltage source and the switching supply 66 behaves like a current source.

As previously mentioned, in one embodiment of the RF communications system 10 illustrated in FIG. 1, the RF PA 24 receives and amplifies the RF input signal RFI to provide the RF transmit signal RFT using the envelope tracking power supply voltage EPV, which provides power for amplification. As such, in a first embodiment of the envelope tracking power supply voltage EPV, a bandwidth of the envelope tracking power supply voltage EPV is greater than 10 megahertz. In a second embodiment of the envelope tracking power supply voltage EPV, a bandwidth of the envelope tracking power supply voltage EPV is greater than 20 megahertz. In a third embodiment of the envelope tracking power supply voltage EPV, a bandwidth of the envelope tracking power supply voltage EPV is greater than 30 megahertz. In a fourth embodiment of the envelope tracking power supply voltage EPV, a bandwidth of the envelope tracking power supply voltage EPV is greater than 40 megahertz.

In a fifth embodiment of the envelope tracking power supply voltage EPV, a bandwidth of the envelope tracking power supply voltage EPV is greater than 50 megahertz. In an alternate embodiment of the envelope tracking power supply voltage EPV, a bandwidth of the envelope tracking power supply voltage EPV is less than 100 megahertz.

Figure 11:
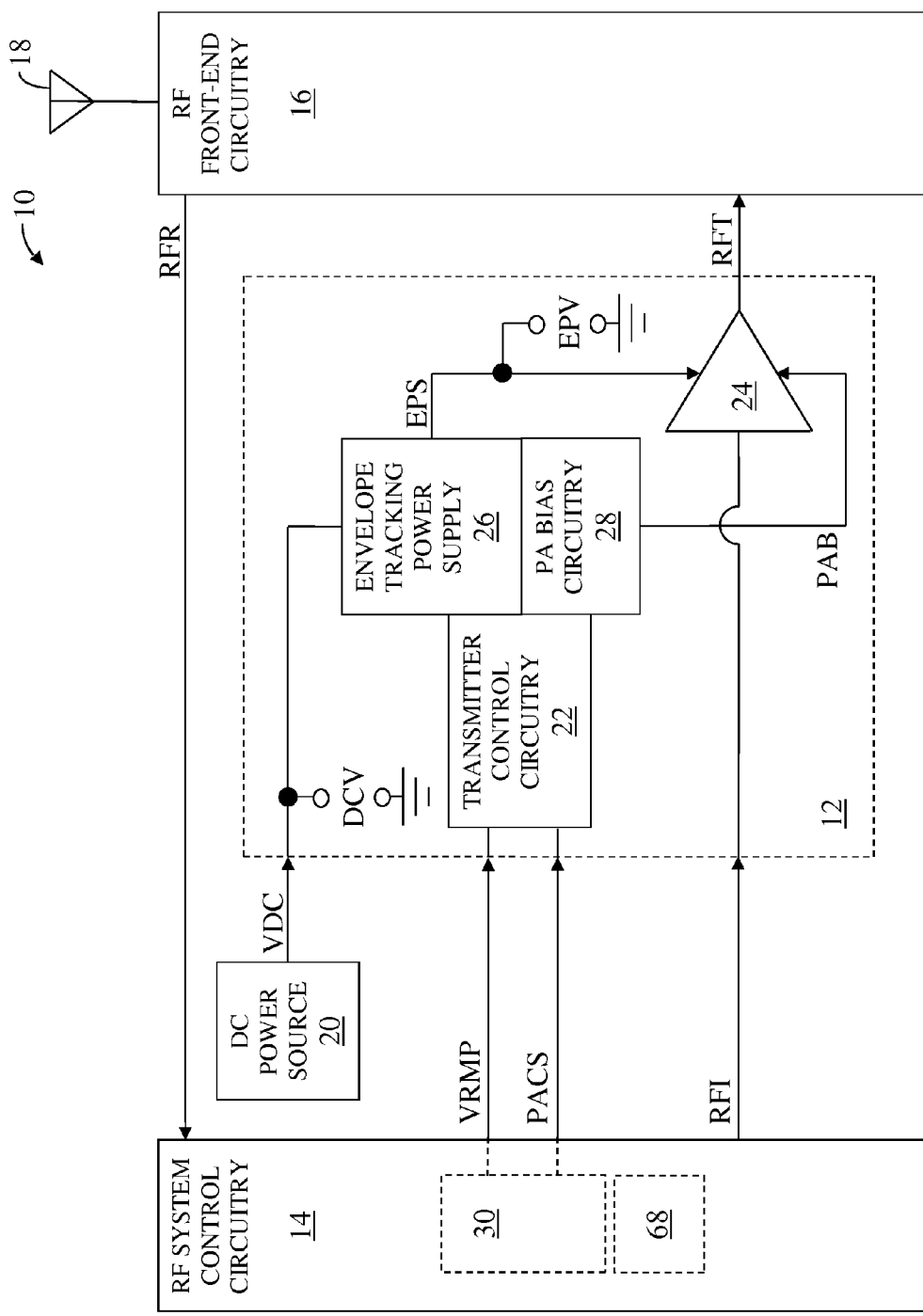
FIG. 11 shows the RF communications system according to another embodiment of the RF communications system.

FIG. 11 shows the RF communications system 10 according to another embodiment of the RF communications system 10. The RF communications system 10 illustrated in FIG. 11 is similar to the RF communications system 10 illustrated in FIG. 1, except in the RF communications system 10 illustrated in FIG. 11, the RF system control circuitry 14 further includes look-up table (LUT)-based constrained setpoint data 68, which may be used by the RF system control circuitry 14 to provide the constrained setpoint. As such, the constrained setpoint is based on the LUT-based constrained setpoint data 68. Further, the RF system control circuitry 14 provides the constrained setpoint to the envelope tracking power supply 26 via the envelope power supply control signal VRMP.

In one embodiment of the RF system control circuitry 14, the RF system control circuitry 14 is the RF transceiver circuitry. As such, the RF transceiver circuitry includes the LUT-based constrained setpoint data 68, which may be used by the RF transceiver circuitry to provide the constrained setpoint.

As such, the constrained setpoint is based on the LUT-based constrained setpoint data 68. Further, the RF transceiver circuitry provides the constrained setpoint to the envelope tracking power supply 26 via the envelope power supply control signal VRMP.

Figure 12:
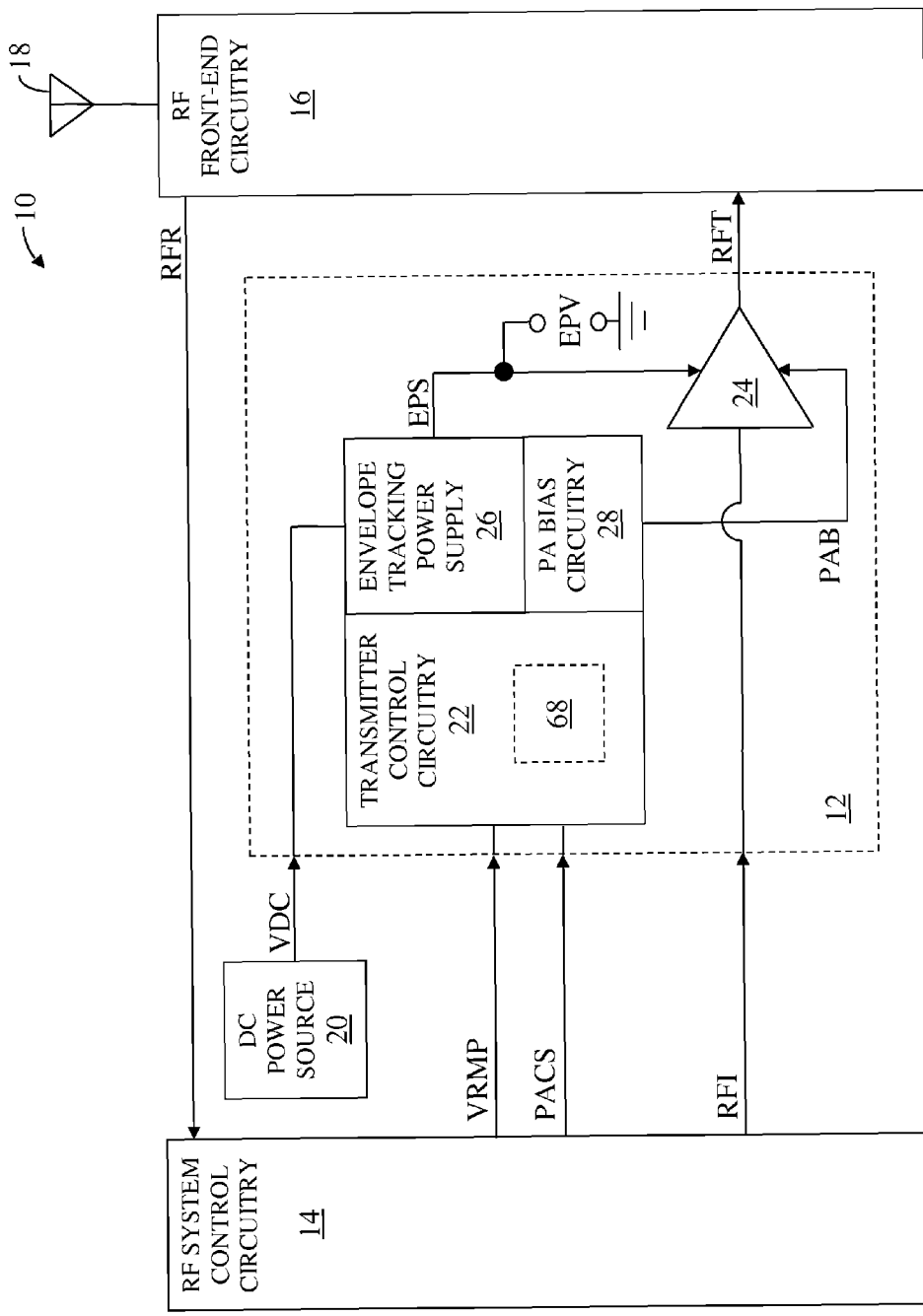
FIG. 12 shows the RF communications system according to a further embodiment of the RF communications system.

FIG. 12 shows the RF communications system 10 according to a further embodiment of the RF communications system 10. The RF communications system 10 illustrated in FIG. 12 is similar to the RF communications system 10 illustrated in FIG. 1, except in the RF communications system 10 illustrated in FIG. 12, the transmitter control circuitry 22 includes the LUT-based constrained setpoint data 68, which may be used by the transmitter control circuitry 22 to provide the constrained setpoint.

As such, the constrained setpoint is based on the LUT-based constrained setpoint data 68.

Figure 13:
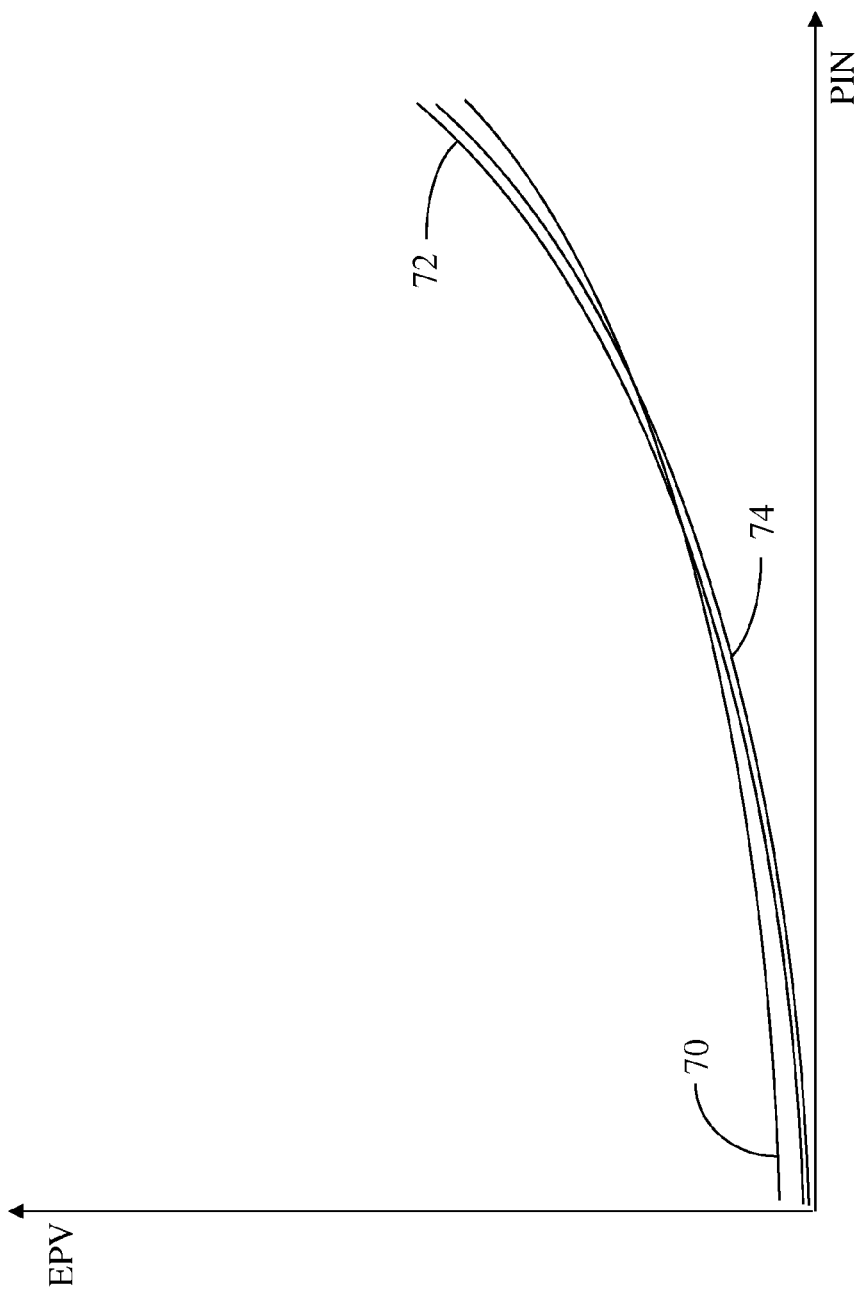
FIG. 13 is a graph illustrating a relationship between the envelope tracking power supply voltage and an input power to the RF PA illustrated in FIG. 1 according to one embodiment of the RF communications system.

FIG. 13 is a graph illustrating a relationship between the envelope tracking power supply voltage EPV and an input power PIN to the RF PA 24 illustrated in FIG. 1. The graph shows a first PA bias condition curve 70, a second PA bias condition curve 72, and a third PA bias condition curve 74. Each of the PA bias condition curves 70, 72, 74 represents a different bias condition for the RF PA 24. In general, the RF PA 24 operates in one of a group of bias conditions, which is represented by one of a group of PA bias condition curves 70, 72, 74. One of the group of bias conditions is a low side constrained bias condition, which may allow the envelope tracking power supply 26 (FIG. 1) to operate with higher overall efficiency when the low side of the envelope tracking power supply voltage EPV is constrained. As such, when the constrained setpoint is based on the low side constraint 42 (FIG. 4) of the envelope tracking power supply voltage EPV, the RF PA 24 operates in the low side constrained bias condition.

Those skilled in the art will recognize improvements and modifications to the embodiments of the present disclosure. All such improvements and modifications are considered within the scope of the concepts disclosed herein and the claims that follow.

What is claimed is:

1. In a radio frequency (RF) system that includes an RF power amplifier (PA) configured to use an envelope tracking power supply voltage to provide an RF transmit signal, which has an RF envelope; and further includes an envelope tracking power supply configured to provide the envelope tracking power supply voltage based on a setpoint; RF transceiver circuitry comprising:
    envelope control circuitry configured to provide the setpoint, such that the envelope tracking power supply voltage is clipped to form clipped regions and substantially tracks the RF envelope between the clipped regions, wherein a dynamic range of the envelope tracking power supply voltage is limited; and
    an RF modulator configured to provide an RF input signal to the RF PA, which receives and amplifies the RF input signal to provide the RF transmit signal.

2. The RF transceiver circuitry of claim 1 wherein the RF transceiver circuitry comprises look-up table-based constrained setpoint data, such that the setpoint is based on the look-up table-based constrained setpoint data.

3. The RF transceiver circuitry of claim 1 wherein the RF transceiver circuitry is further configured to provide the envelope power supply control signal to the envelope tracking power supply via a digital communications bus and a digital communications interface.

4. The RF transceiver circuitry of claim 1 wherein the setpoint is based on a high side constraint of the envelope tracking power supply voltage, which has a dynamic range that is limited to a high side constrained dynamic range, such that the clipped regions correspond to peaks in the RF envelope.

5. The RF transceiver circuitry of claim 4 wherein when transitioning between an unconstrained operating region of the envelope tracking power supply voltage and a high side constrained operating region of the envelope tracking power supply voltage, the envelope tracking power supply voltage is hard clipped in the high side constrained operating region.

6. The RF transceiver circuitry of claim 4 wherein when transitioning between an unconstrained operating region of the envelope tracking power supply voltage and a high side constrained operating region of the envelope tracking power supply voltage, the envelope tracking power supply voltage is smoothly clipped between the unconstrained operating region and the high side constrained operating region.

7. The RF transceiver circuitry of claim 6 wherein the envelope tracking power supply voltage is based on a $3^{RD}$ order polynomial between the unconstrained operating region and the high side constrained operating region.

8. The RF transceiver circuitry of claim 6 wherein the envelope tracking power supply voltage is based on a piecewise spline function between the unconstrained operating region and the high side constrained operating region.

9. The RF transceiver circuitry of claim 1 wherein the setpoint is based on a low side constraint of the envelope tracking power supply voltage, which has a dynamic range that is limited to a low side constrained dynamic range, such that the clipped regions correspond to valleys in the RF envelope.

10. The RF transceiver circuitry of claim 9 wherein when transitioning between an unconstrained operating region of the envelope tracking power supply voltage and a low side constrained operating region of the envelope tracking power supply voltage, the envelope tracking power supply voltage is hard clipped in the low side constrained operating region.

11. The RF transceiver circuitry of claim 9 wherein when transitioning between an unconstrained operating region of the envelope tracking power supply voltage and a low side constrained operating region of the envelope tracking power supply voltage, the envelope tracking power supply voltage is smoothly clipped between the unconstrained operating region and the low side constrained operating region.

12. The RF transceiver circuitry of claim 11 wherein the envelope tracking power supply voltage is based on a $3^{RD}$ order polynomial between the unconstrained operating region and the low side constrained operating region.

13. The RF transceiver circuitry of claim 11 wherein the envelope tracking power supply voltage is based on a piecewise spline function between the unconstrained operating region and the low side constrained operating region.

14. The RF transceiver circuitry of claim 9 wherein when the setpoint is based on the low side constraint of the envelope tracking power supply voltage, the RF PA is further configured to operate in a low side constrained PA bias condition.

15. The RF transceiver circuitry of claim 1 wherein the setpoint is based on a high side constraint of the envelope tracking power supply voltage and a low side constraint of the envelope tracking power supply voltage, which has a dynamic range that is limited to a both sides constrained dynamic range, such that the clipped regions correspond to both peaks and valleys in the RF envelope.

16. Circuitry comprising:
  transmitter control circuitry configured to provide a setpoint, such that an envelope tracking power supply voltage is clipped to form clipped regions and substantially tracks an RF envelope between the clipped regions, wherein a dynamic range of the envelope tracking power supply voltage is limited;
  a radio frequency (RF) power amplifier (PA) configured to receive and amplify an RF input signal to provide an RF transmit signal, which has the RF envelope, using the envelope tracking power supply voltage; and
  an envelope tracking power supply configured to provide the envelope tracking power supply voltage based on the setpoint.

17. The circuitry of claim 16 wherein the transmitter control circuitry comprises look-up table-based constrained setpoint data, such that the setpoint is based on the look-up table-based constrained setpoint data.

18. The circuitry of claim 16 wherein the setpoint is based on a high side constraint of the envelope tracking power supply voltage, which has a dynamic range that is limited to a high side constrained dynamic range, such that the clipped regions correspond to peaks in the RF envelope.

19. The circuitry of claim 18 wherein when transitioning between an unconstrained operating region of the envelope tracking power supply voltage and a high side constrained operating region of the envelope tracking power supply voltage, the envelope tracking power supply voltage is hard clipped in the high side constrained operating region.

20. The circuitry of claim 18 wherein when transitioning between an unconstrained operating region of the envelope tracking power supply voltage and a high side constrained operating region of the envelope tracking power supply voltage, the envelope tracking power supply voltage is smoothly clipped between the unconstrained operating region and the high side constrained operating region.

21. The circuitry of claim 20 wherein the envelope tracking power supply voltage is based on a $3^{RD}$ order polynomial between the unconstrained operating region and the high side constrained operating region.

22. The circuitry of claim 20 wherein the envelope tracking power supply voltage is based on a piecewise spline function between the unconstrained operating region and the high side constrained operating region.

23. The circuitry of claim 16 wherein the setpoint is based on a low side constraint of the envelope tracking power supply voltage, which has a dynamic range that is limited to a low side constrained dynamic range, such that the clipped regions correspond to valleys in the RF envelope.

24. The circuitry of claim 23 wherein when transitioning between an unconstrained operating region of the envelope tracking power supply voltage and a low side constrained operating region of the envelope tracking power supply voltage, the envelope tracking power supply voltage is hard clipped in the low side constrained operating region.

25. The circuitry of claim 23 wherein when transitioning between an unconstrained operating region of the envelope tracking power supply voltage and a low side constrained operating region of the envelope tracking power supply voltage, the envelope tracking power supply voltage is smoothly clipped between the unconstrained operating region and the low side constrained operating region.

26. The circuitry of claim 25 wherein the envelope tracking power supply voltage is based on a $3^{RD}$ order polynomial between the unconstrained operating region and the low side constrained operating region.

27. The circuitry of claim 25 wherein the envelope tracking power supply voltage is based on a piecewise spline function between the unconstrained operating region and the low side constrained operating region.

28. The circuitry of claim 23 wherein when the setpoint is based on the low side constraint of the envelope tracking power supply voltage, the RF PA is further configured to operate in a low side constrained PA bias condition.

29. The circuitry of claim 16 wherein the setpoint is based on a high side constraint of the envelope tracking power supply voltage and a low side constraint of the envelope tracking power supply voltage, which has a dynamic range that is limited to a both sides constrained dynamic range, such that the clipped regions correspond to both peaks and valleys in the RF envelope.

* * * * *